(12) United States Patent
Ghandehari et al.

(10) Patent No.: US 7,888,269 B2
(45) Date of Patent: Feb. 15, 2011

(54) TRIPLE LAYER ANTI-REFLECTIVE HARD MASK

(75) Inventors: Kouros Ghandehari, Santa Clara, CA (US); Hirokazu Tokuno, Cupertino, CA (US); David Matsumoto, San Jose, CA (US); Christopher H. Raeder, Austin, TX (US); Christopher Foster, Austin, TX (US); Weidong Qian, Sunnyvale, CA (US); Minh Van Ngo, Fremont, CA (US)

(73) Assignees: Spansion LLC, Sunnyvale, CA (US); GlobalFoundries, Inc., Grand Cayman (KY)

( * ) Notice: Subject to any disclaimer, the term of this patent is extended or adjusted under 35 U.S.C. 154(b) by 222 days.

(21) Appl. No.: 11/256,184

(22) Filed: Oct. 24, 2005

(65) Prior Publication Data
US 2007/0093070 A1    Apr. 26, 2007

(51) Int. Cl.
*H01L 21/302*    (2006.01)
*H01L 21/461*    (2006.01)
(52) U.S. Cl. .................. 438/717; 438/786; 438/671; 257/E21.267
(58) Field of Classification Search .................. 438/952
See application file for complete search history.

(56) References Cited

U.S. PATENT DOCUMENTS

| | | | |
|---|---|---|---|
| 6,100,559 A | 8/2000 | Park | |
| 6,316,167 B1 * | 11/2001 | Angelopoulos et al. | 430/313 |
| 6,352,922 B1 * | 3/2002 | Kim | 438/648 |
| 6,524,945 B2 | 2/2003 | Iwasaki | |
| 6,624,068 B2 | 9/2003 | Thakar et al. | |
| 6,664,177 B1 | 12/2003 | Lin et al. | |
| 6,780,708 B1 * | 8/2004 | Kinoshita et al. | 438/241 |
| 6,864,150 B2 * | 3/2005 | Lin et al. | 438/424 |
| 6,995,437 B1 * | 2/2006 | Kinoshita et al. | 257/391 |
| 7,300,730 B1 * | 11/2007 | Willis et al. | 430/30 |
| 2003/0124818 A1 * | 7/2003 | Luo et al. | 438/482 |
| 2004/0175630 A1 * | 9/2004 | Wasson et al. | 430/5 |
| 2006/0051964 A1 * | 3/2006 | Xia et al. | 438/706 |

OTHER PUBLICATIONS

International Search Report mailed Jan. 23, 2007 for corresponding International Application No. PCT/US2006/039538.

* cited by examiner

*Primary Examiner*—Jarrett J Stark
(74) *Attorney, Agent, or Firm*—Harrity & Harrity, LLP

(57) ABSTRACT

A method includes forming a layer of silicon oxynitride (SiON), silicon rich nitride (SiRN) or silicon nitride ($Si_3N_4$) over a layer of semiconducting material. The method further includes forming a first layer of anti-reflective material over the layer of SiON, SiRN or $Si_3N_4$ and forming a second layer of anti-reflective material over the first layer. The method also includes using the first layer, second layer and layer of SiON, SiRN or $Si_3N_4$ as a mask when etching a pattern in the layer of semiconducting material.

10 Claims, 16 Drawing Sheets
(2 of 16 Drawing Sheet(s) Filed in Color)

US 7,888,269 B2

TRIPLE LAYER ANTI-REFLECTIVE HARD MASK

TECHNICAL FIELD

The present invention relates generally to semiconductor devices and, more particularly, to the use of a triple layer bottom anti-reflective coating (BARC) when patterning structures in semiconductor devices using photolithography.

BACKGROUND ART

Integrated circuits (ICs) can include millions of semiconductor devices, such as non-volatile memory devices. Though existing fabrication systems have the capability of fabricating millions of semiconductor devices in an integrated circuit, there is still a need to decrease the size of IC device features so that the number of devices on an IC may be increased.

Conventional photolithographic techniques represent one limitation to the size of critical dimensions associated with devices in an IC. Conventional photolithographic techniques are used to transfer patterns onto semiconductor devices so that desired structures can be fabricated. Typically, a device layer, in which structures are to be formed, is coated with a layer of photo-resist material and a radiation source is used to expose selected areas of the surface of the photo-resist. Exposure of the photo-resist layer causes an image area, corresponding to the desired pattern, to be more soluble in a particular developer. The more soluble areas may be removed in a conventional developing process to leave the patterned image in the photo-resist layer. An etching process may then be applied to the patterned photo-resist layer to remove selected portions of the underlying device layer to form the desired structures in the device layer.

One problem with conventional photolithographic techniques is that reflectively of the layers being patterned can cause large variations in critical dimensions (CDs) of the devices being fabricated. Conventionally, a layer of anti-reflective coating (ARC) has been used to attempt to minimize the variations in critical dimensions that occur due to the reflectivity of the layers being patterned. A substantial swing in device critical dimensions, however, may still occur using the ARC layer in existing photolithographic techniques.

DISCLOSURE OF THE INVENTION

According to an aspect of the invention, a method may include forming a layer of silicon oxynitride (SiON), silicon rich nitride (SiRN) or silicon nitride ($Si_3N_4$) over a layer of semiconducting material. The method may further include forming a first layer of anti-reflective material over the layer of SiON, SiRN or $Si_3N_4$ and forming a second layer of anti-reflective material over the first layer. The method may also include using the first layer, second layer and layer of SiON, SiRN or $Si_3N_4$ as a mask when etching a pattern in the layer of semiconducting material.

According to a further aspect of the invention, a method of forming a trench in a material may include forming a layer of silicon oxynitride (SiON), silicon rich nitride (SiRN), or silicon nitride ($Si_3N_4$) over the material and forming a first anti-reflective layer over the layer of SiON, SiRN or $Si_3N_4$, the first anti-reflective layer having a first extinction coefficient. The method may further include forming a second anti-reflective layer over the first anti-reflective layer, the second anti-reflective layer having a second extinction coefficient, where the second extinction coefficient is smaller than the first extinction coefficient. The method may also include forming a first trench through the first anti-reflective layer, the second anti-reflective layer and the layer of SiON, SiRN, or $Si_3N_4$ and forming a second trench in the material through the first trench. The method may further include removing the first anti-reflective layer, the second anti-reflective layer and the layer of SiON, SiRN, or $Si_3N_4$.

Other features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

The patent or application file contains at least one drawing executed in color. Copies of this patent or patent application publication with color drawing(s) will be provided by the Office upon request and payment of the necessary fee. Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Consistent with aspects of the invention, a triple layer BARC mask is used for forming structures in a semiconductor device using photolithographic techniques. A first layer may be formed over a layer of material that is to be patterned using photolithography. The first BARC layer may include an anti-reflective material, such as, for example, silicon oxynitride (SiON), silicon rich nitride (SiRN), or silicon nitride ($Si_3N_4$). A second BARC layer formed on the first BARC layer may include a second anti-reflective material, such as, for example, SiON, SiRN, or $Si_3N_4$ having a high coefficient of extinction. A third BARC layer formed on the second BARC layer may include a third anti-reflective material, such as, for example, SiON, SiRN or $Si_3N_4$ having a low coefficient of extinction. This triple layer BARC has excellent reflectivity characteristics that increase the accuracy of the photolithographic process, thus, reducing variations in critical dimensions of the structures being fabricated.

Figure 1:
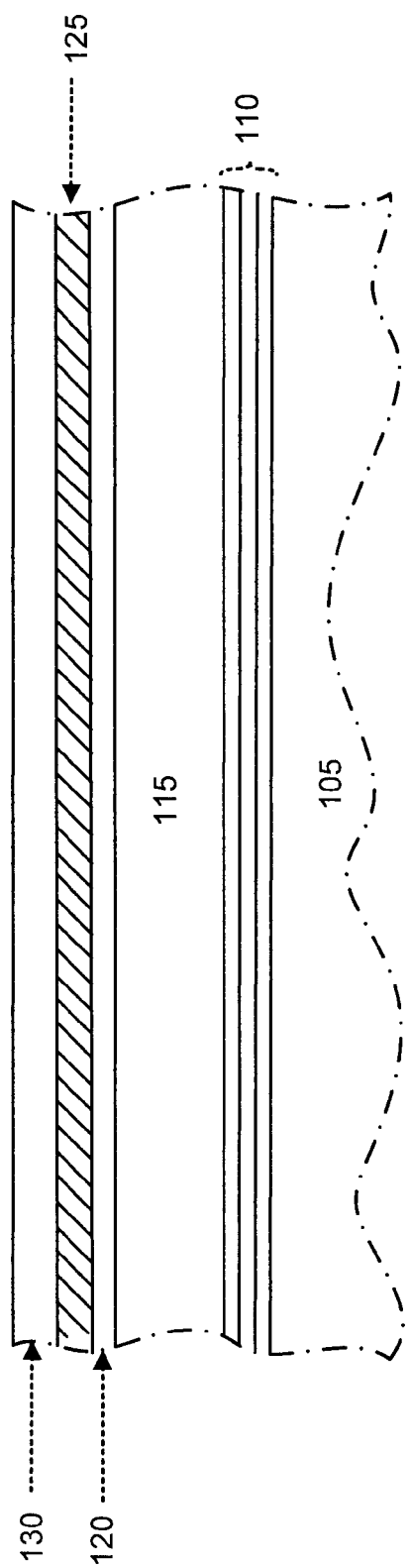
FIG. 1 illustrates the formation of a triple layer BARC over layers of a device that are to be patterned using photolithography.

FIG. 1 illustrates a cross-section of a semiconductor substrate 105 according to an exemplary embodiment of the invention. Substrate 105, consistent with one aspect, may include a crystal silicon wafer. In other implementations, substrate 105 may include a gallium arsenide layer, a silicon-on-insulator structure, a germanium layer, a silicon-germanium layer, or other conventional materials used to form a semiconductor substrate.

An oxide-nitride-oxide (ONO) stack 110 may be formed over substrate 105. ONO stack may include a bottom oxide layer, a charge storage layer, and a top oxide layer. The bottom oxide layer may be formed on substrate 105 using, for example, existing deposition processes, such as a chemical vapor deposition (CVD) process. The bottom oxide layer may include oxide materials, such as, for example, silicon oxide (i.e., $SiO_2$), or silicon oxynitride. The thickness of the bottom oxide layer may range, for example, from about 25 Å to about 250 Å.

The charge storage layer of ONO stack 110 may be formed on the bottom oxide layer using, for example, existing deposition processes, such as conventional CVD processes. In one exemplary embodiment, the charge storage layer may include a nitride charge storage layer, such as, for example, silicon nitride ($Si_3N_4$). In other embodiments, the charge storage layer may include other known dielectric materials that may be used to store a charge. The thickness of the charge storage layer may range, for example, from about 25 Å to about 250 Å. In other embodiments, the charge storage layer may include a conductive material, such as polycrystalline silicon, used to form a floating gate electrode.

The top oxide layer of ONO stack 110 may be formed on the charge storage layer using, for example, existing deposition processes, such as a CVD process. The top oxide layer may include oxide materials, such as, for example, silicon oxide, or silicon oxynitride. The thickness of the top oxide layer may range, for example, from about 25 Å to about 250 Å.

A layer 115 of material may be formed over ONO stack 110. Layer 115 may include, for example, polycrystalline silicon though other materials may be used. Layer 115 may be formed using, for example, existing deposition processes, such as a chemical vapor deposition (CVD) process. The thickness of layer 115 may range, for example, from about 300 Å to about 2500 Å.

A first BARC layer 120 may be formed over layer 115. BARC layer 120 may be formed using, for example existing deposition processes, such as a chemical vapor deposition (CVD) process. BARC layer 120 may include a material, such as, for example, SiON, SiRN or $Si_3N_4$. The thickness of layer 120 may range, for example, from about 50 Å to about 250Å. In one embodiment, layer 120 may have a thickness of 100 Å.

A second BARC layer 125 may be formed over layer 120. Second BARC Layer 125 may e formed using, for example, existing deposition processes, such as a chemical vapor deposition (CVD) process. Second BARC Layer 125 may include a material, such as, for example, SiON, SiRN or $Si_3N_4$, that has a high extinction coefficient. As one skilled in the art will recognize, the extinction coefficient includes a sum of the absorption coefficient and the scattering coefficient, where the absorption coefficient measures the attenuation caused by absorption of energy that results from its passage through layer 125 and where the scattering coefficient expresses the attenuation caused by scattering of energy during its passage through layer 125. Second BARC Layer 125 may have an extinction coefficient ranging from about 0.5 to about 1.3. In one embodiment, second BARC layer 125 may have an extinction coefficient of approximately 1.05. The thickness of second BARC layer 125 may range, for example, from about 150 Å to about 1250 Å

A third BARC layer 130 may be formed over layer 125. Third BARC Layer 130 may be formed using, for example, existing deposition processes, such as a chemical vapor deposition (CVD) process. Third BARC Layer 130 may include a material, such as, for example, SiON, SiRN, $Si_3N_4$ or spin-on organic BARC, that has a low extinction coefficient. More specifically, third BARC Layer 130 may have an extinction coefficient ranging from about 0.2 to about 0.5. In one embodiment, third BARC layer 130 may have an extinction coefficient constant of approximately 0.35. The thickness of third BARC layer 130 may range, for example, from about 100 Å to about 700 Å. The material of BARC layers 125 and 130 may be selected such that second BARC layer 125 has a higher extinction coefficient than the extinction coefficient of third BARC layer 130.

Figure 13:
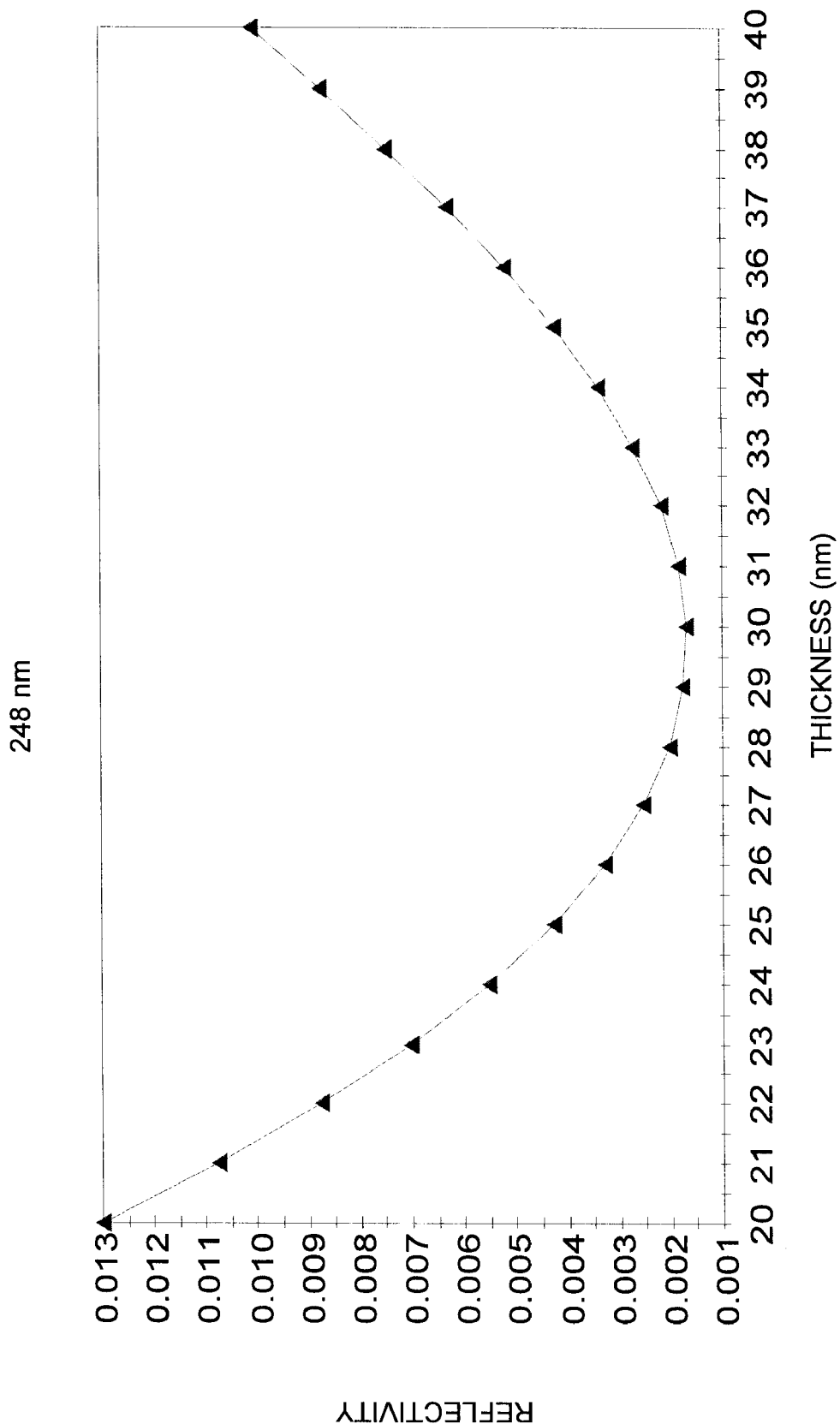
FIG. 13 illustrates a plot of reflectivity versus BARC layer thickness at a wavelength of 248 nm.
Figure 14:
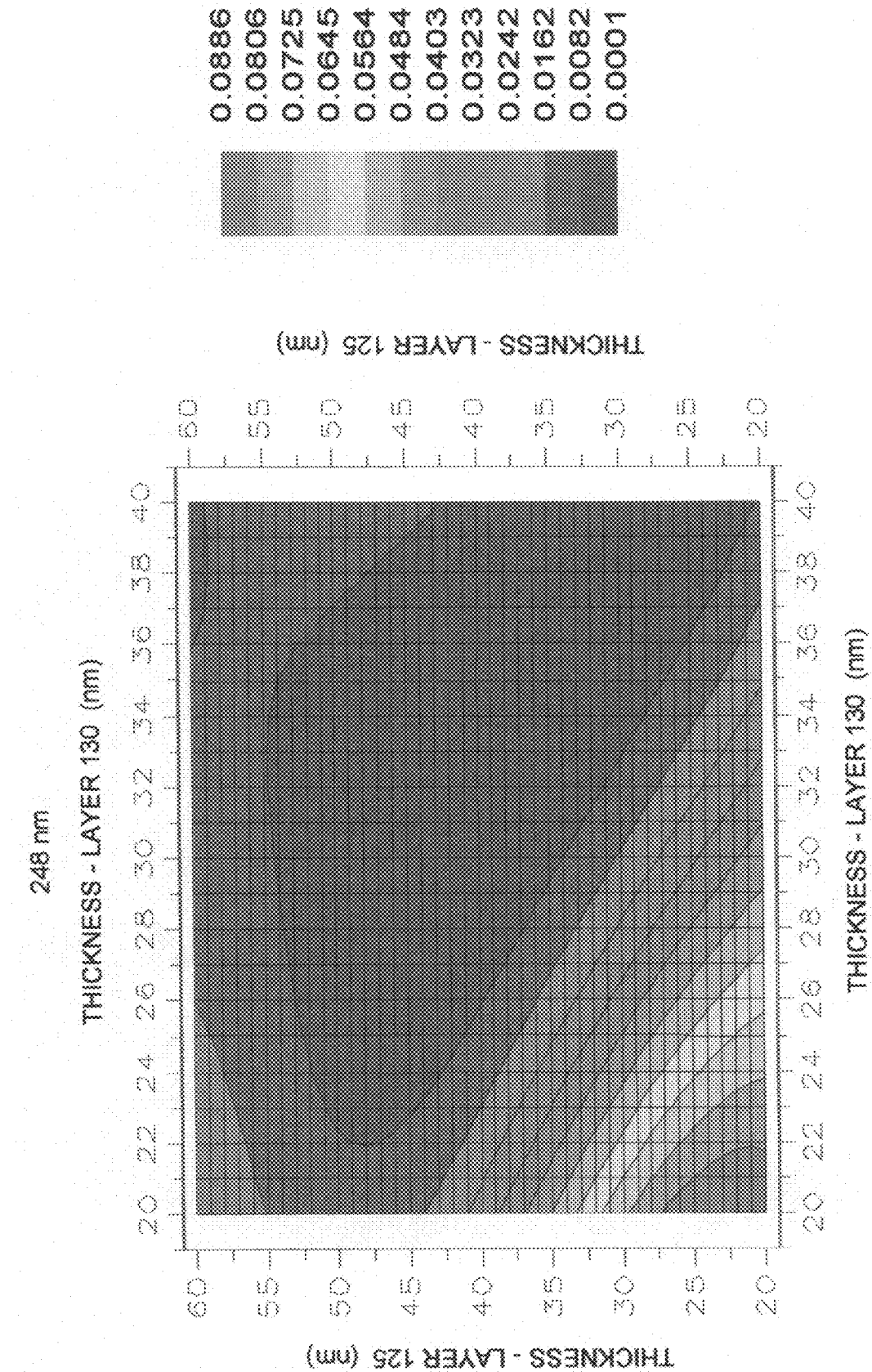
FIG. 14 illustrates a plot of reflectivity versus BARC layer thickness, for two of the BARC layers of the invention, at a wavelength of 248 nm.

Layers 125, 130 and 120 may comprise a three layer bottom anti-reflective coating (BARC) that reduces reflectivity that can impair the accuracy of a subsequently performed photolithographic process. Layers 125, 130, and 120 can each separately be one of SiON, SiRN or $Si_3N_4$. Layer 130 can further separately be spin-on organic BARC. FIG. 13 depicts a plot of reflectivity versus a thickness of layer 130 at a wavelength of 248 nm, where layer 120 includes SiON, layer 125 includes high extinction coefficient SiRN, and layer 130 includes low extinction coefficient SiON. The plot of FIG. 13 assumes a thickness of 100 Å for layer 120 and a thickness of 460 Å of layer 125 and simulates a plot of an overall reflectivity of layers 125, 130 and 120 at a photolithographic exposure wavelength of 248 nm. As can be seen in FIG. 13, reflectivity is a maximum of 0.013 at a thickness of 20 nm of layer 130 and a minimum of approximately 0.002 at a thickness of 30 nm of layer 130. FIG. 14 additionally plots reflectivity versus a thickness of both layers 125 and 130 at an exposure wavelength of 248 nm.

Figure 15:
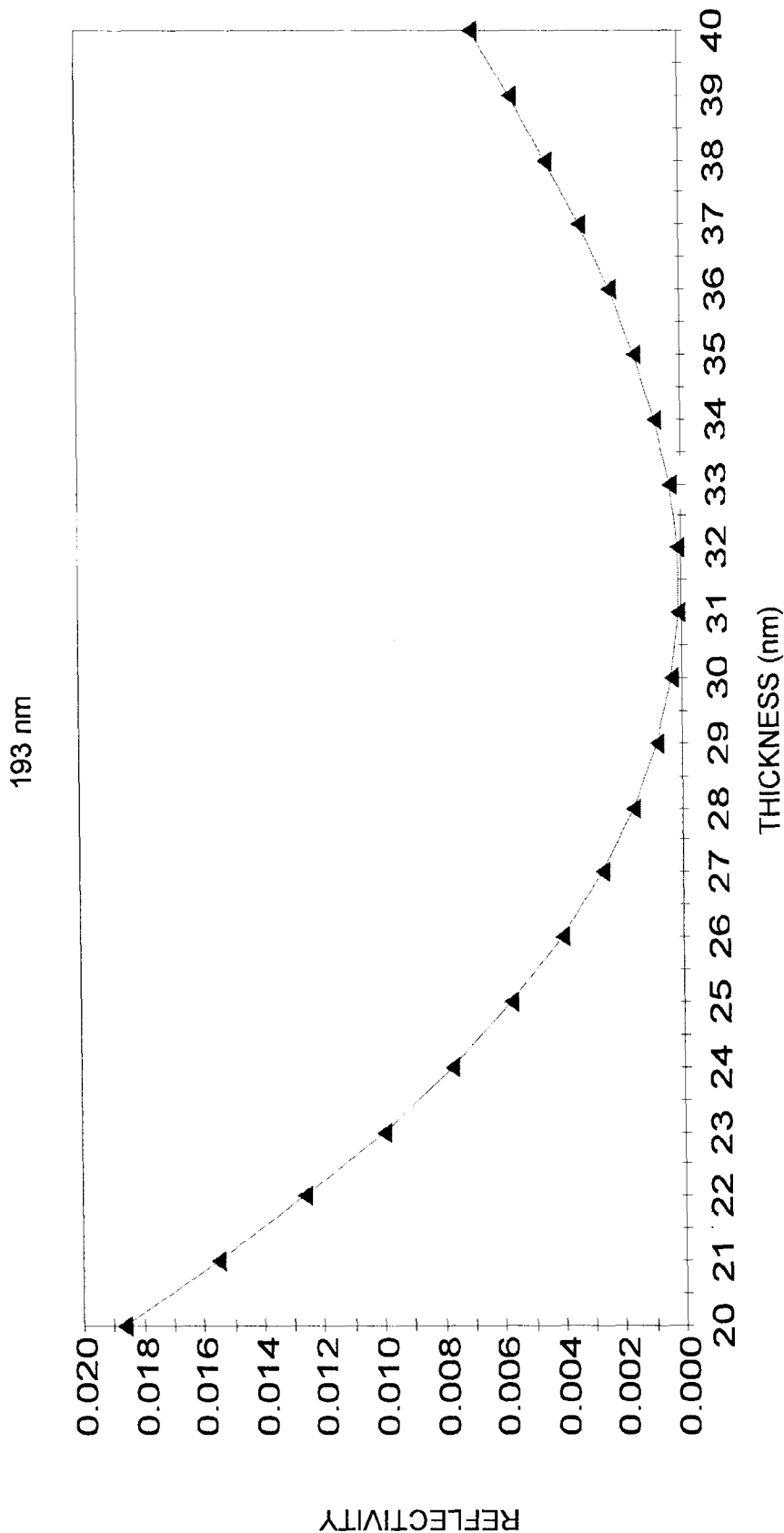
FIG. 15 illustrates a plot of reflectivity versus BARC layer thickness at a wavelength of 193 nm.
Figure 16:
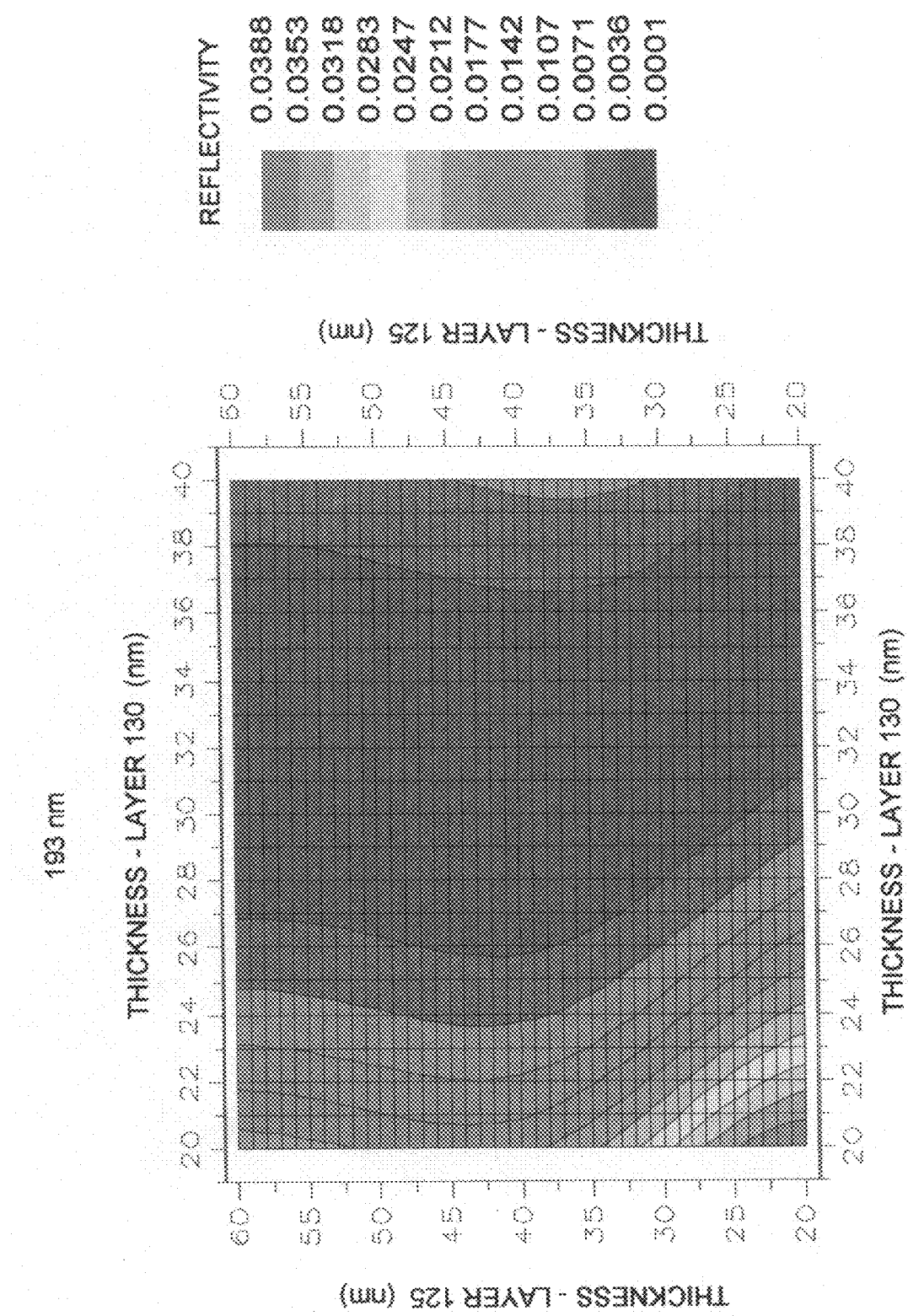
FIG. 16 illustrates a plot of reflectivity versus BARC layer thickness, for two of the BARC layers of the invention, at a wavelength of 193 nm.

FIG. 15 further depicts a plot of reflectivity versus a thickness of layer 130 at a wavelength of 193 nm, where layer 120 includes SiON, layer 125 includes high extinction coefficient SiRN, and layer 130 includes low extinction coefficient SiON. The plot of FIG. 15 assumes a thickness of 100 Å of layer 120 and a thickness of 460 Å of layer 125 and simulates a plot of an overall reflectivity of layers 125, 130 and 120 at a photolithographic exposure wavelength of 193 nm. As can be seen in FIG. 15, reflectivity is a maximum of approximately 0.018 at a thickness of 20 nm of layer 130 and a minimum of approximately 0.000 at a thickness of 31 nm. FIG. 16 additionally plots reflectivity versus a thickness of both layers 125 and 130 at an exposure wavelength of 193 nm.

Figure 2:
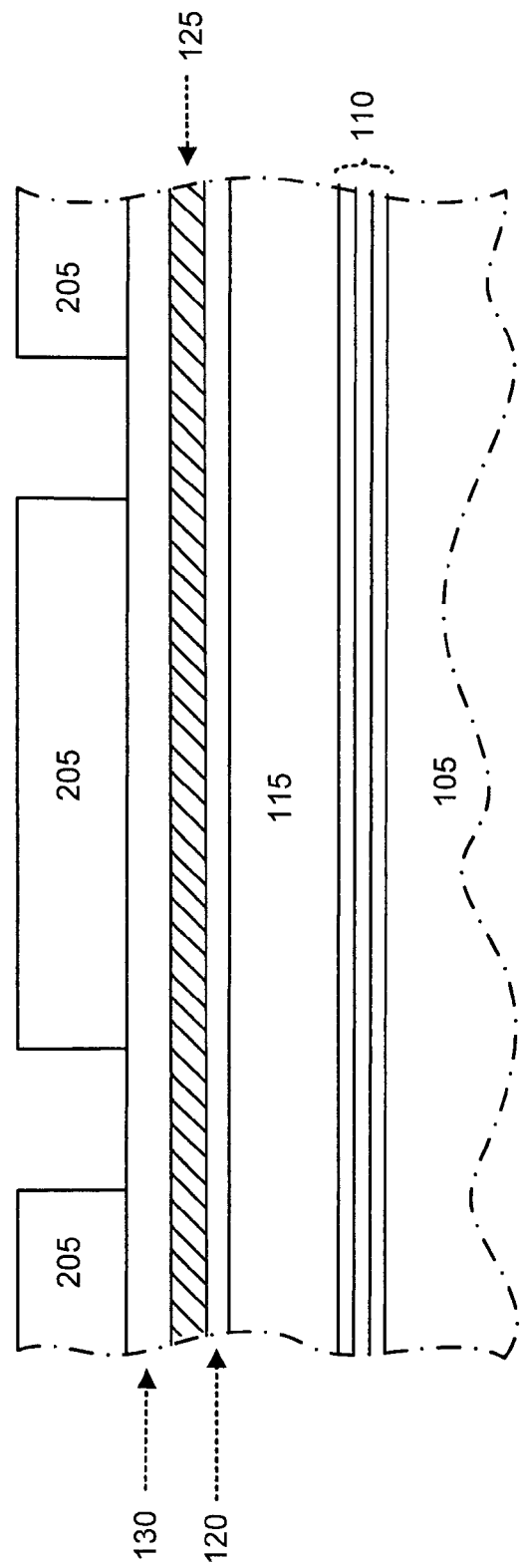
FIG. 2 illustrates the formation of a layer of patterned photo-resist over the triple layer BARC of FIG. 1 consistent with an aspect of the invention.
Figure 3:
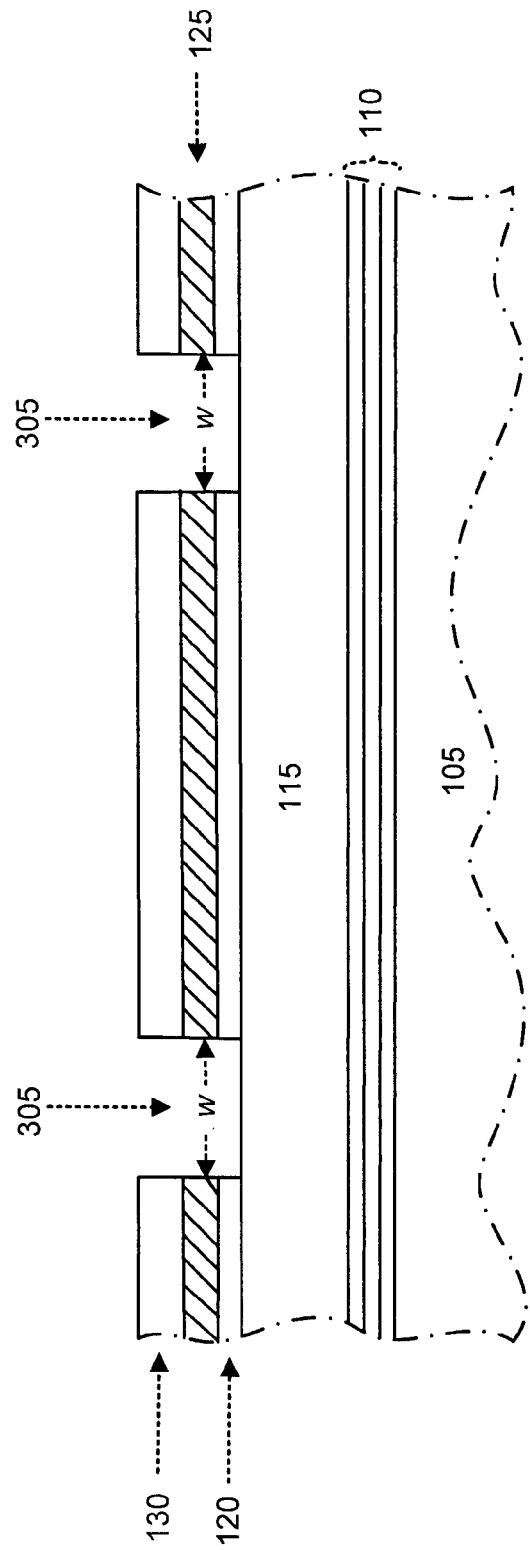
FIG. 3 illustrates the etching of the triple layer BARC of FIG. 2 consistent with an aspect of the invention.

As shown in FIG. 2, a layer 205 of photo-resist may be formed on layer 130 and patterned using existing photolithographic techniques. Utilizing the low reflectivity of the triple BARC layers 120, 125 and 130, the pattern may be transferred to photo-resist layer 205 accurately with minimal variations in critical dimensions of the pattern being transferred. After patterning, layer 205 may, thus, serve as a mask for subsequent etching of layers 130, 125 and 120. As further shown in FIG. 3, trenches 305 may be formed, using layer 205 as a mask, in layers 130, 125 and 120 using existing etching techniques. Etching of layers 130, 125 and 120, using the mask formed by photo-resist layer 205, transfers the pattern of photo-resist layer 205 to layers 130, 125 and 120. Each trench 305 may have a width w ranging from about 50 Å to about 250 Å. Subsequent to formation of trenches 305, photo-resist layer 205 may be removed using existing stripping techniques including, for example, existing chemical-mechanical polishing (CMP) techniques.

Figure 4:
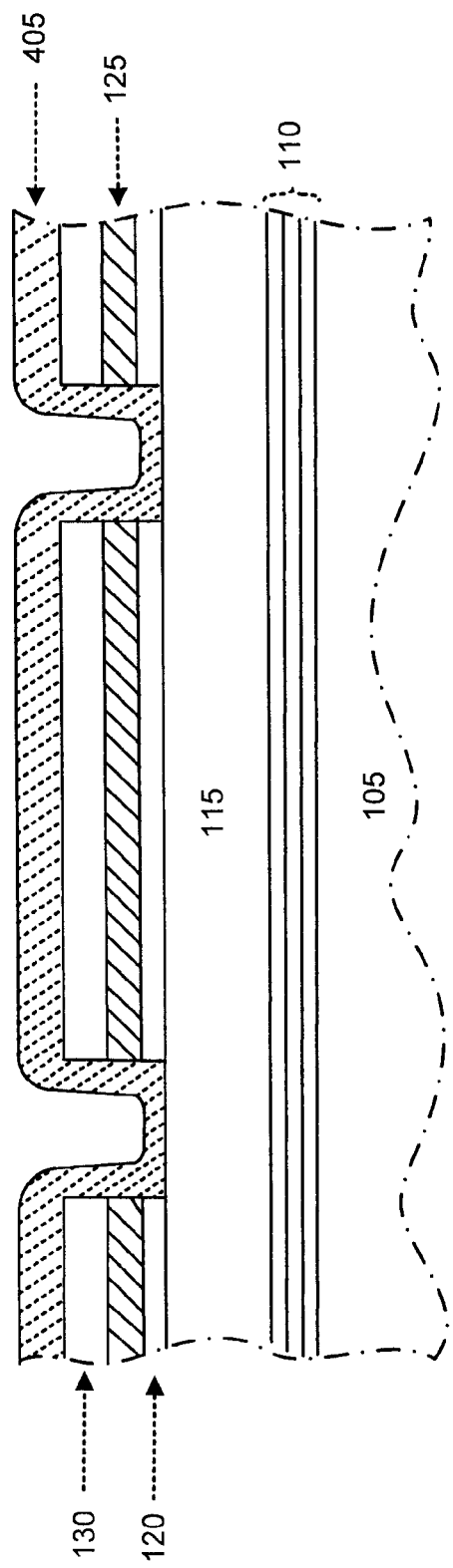
FIG. 4 illustrates the formation of a layer of oxide material over the structure of FIG. 3 consistent with an aspect of the invention.
Figure 5:
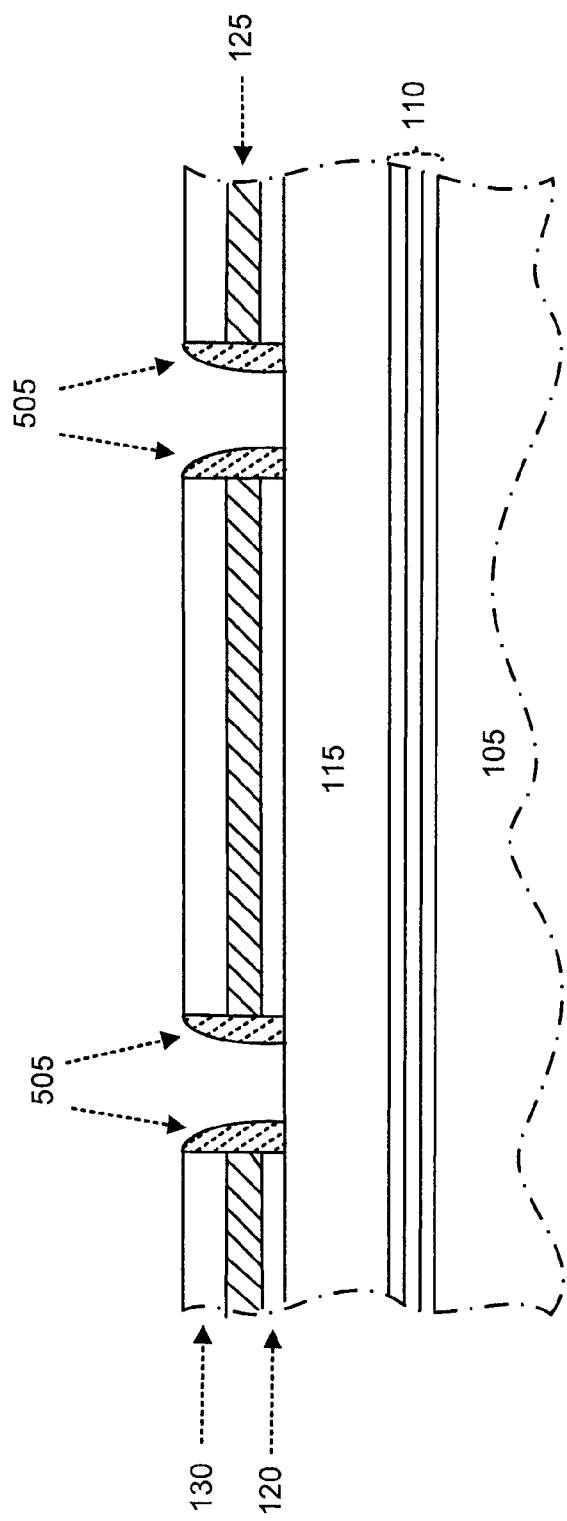
FIG. 5 illustrates the formation of spacers within trenches of the structure of FIG. 4 consistent with an aspect of the invention.

A layer 405 of spacer material may then be formed over layer 130, as shown in FIG. 4. Layer 405 may include a silicon oxide (e.g., $SiO_2$), SiRN or $Si_3N_4$ and may be formed using, for example, existing deposition processes, such as a chemical vapor deposition (CVD) process. The thickness of layer 405 may range, for example, from about 100 Å to about 400 Å. Subsequent to formation of layer 405, spacers 505 may be formed on each vertical surface of each trench 305 from layer 405, as shown in FIG. 5. Spacers 505 may be formed, for example, by etching layer 405 using existing etching techniques. A thickness of each spacer 505 may range from about 100 Å to about 400 Å.

Figure 6:
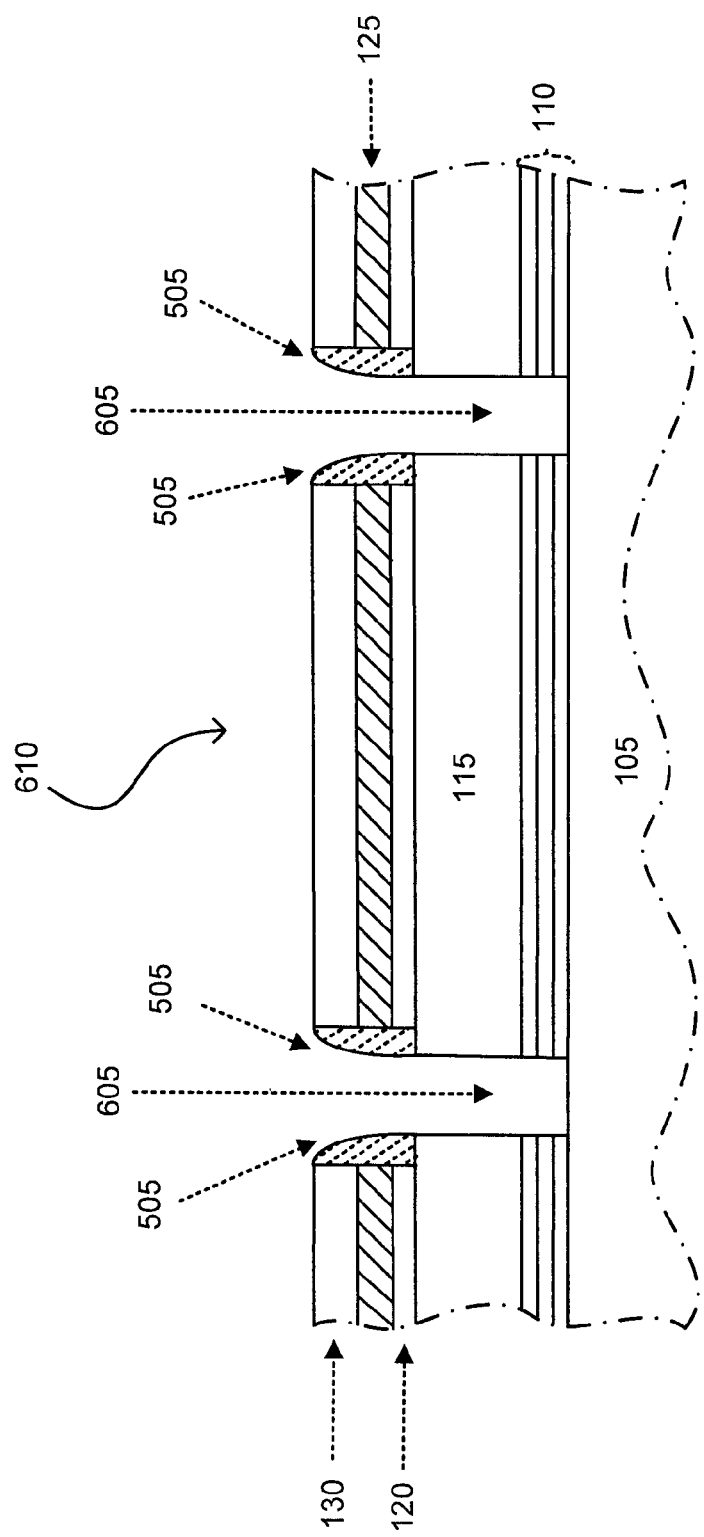
FIG. 6 illustrates the formation of trenches in the structure of FIG. 5 consistent with an aspect of the invention.
Figure 7:
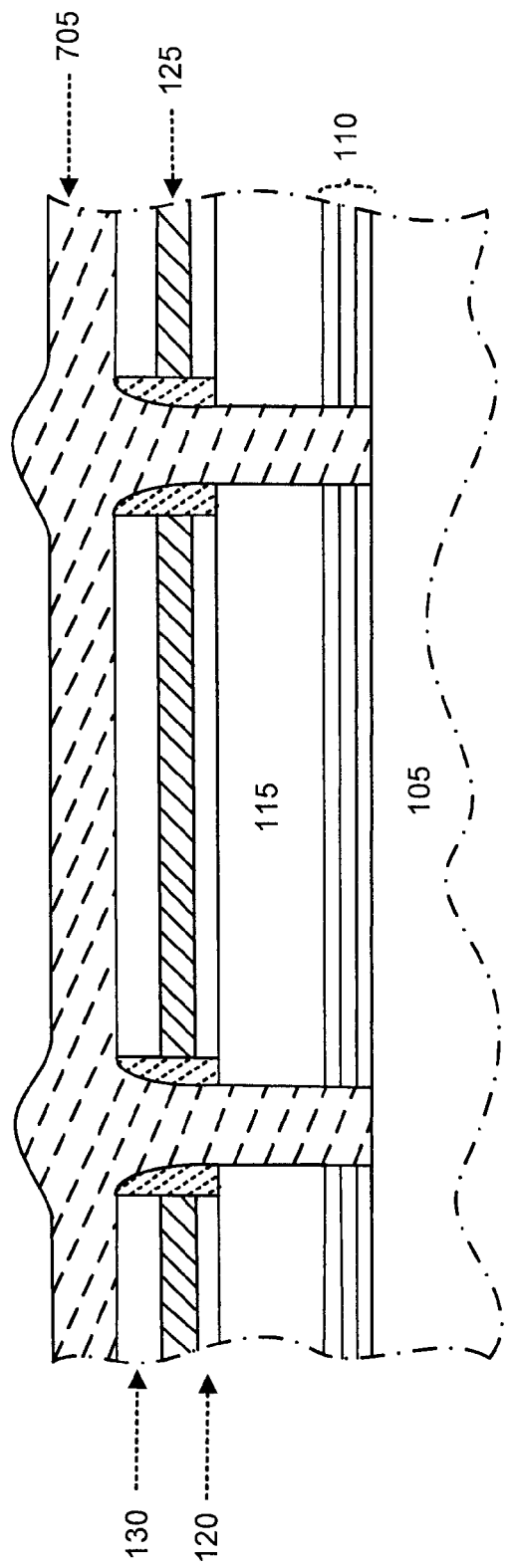
FIG. 7 illustrates the formation of an oxide layer over the structure of FIG. 6 consistent with an aspect of the invention.

Trenches 605 may then be formed in layer 115 and ONO stack 110, as shown in FIG. 6, to form a memory cell mesa 610. Trenches 605 may be formed, for example, using existing etching techniques and using layers 130, 125 and 120 and spacers 505 as a hard mask. Trenches 605 may be formed using substrate 105 as an etch stop layer. Subsequent to formation of trenches 605, a layer 705 of a dielectric material (e.g., oxide), may be formed over layer 130 and in trenches 605, as shown in FIG. 7. Layer 705 may be formed using, for example, existing high density plasma (HDP) oxide deposition techniques. A thickness of layer 705 may range from about 1,000 Å to about 3,000 Å.

Figure 8:
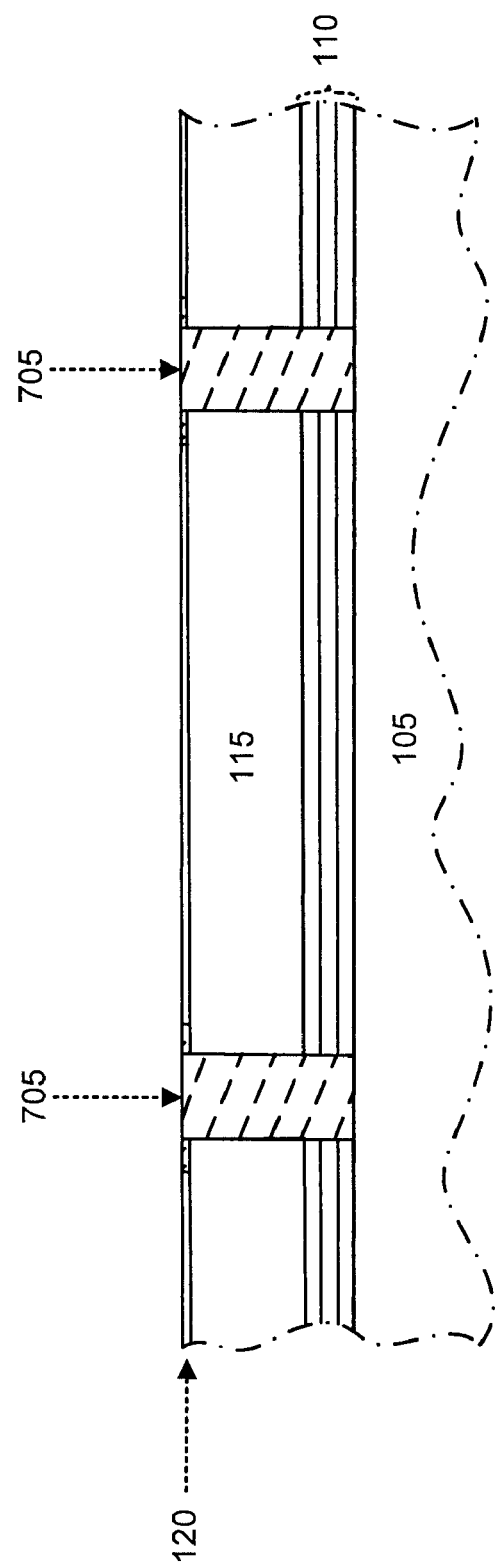
FIGS. 8 & 9 illustrate the removal of portions of the structure of FIG. 7 consistent with an aspect of the invention.
Figure 9:
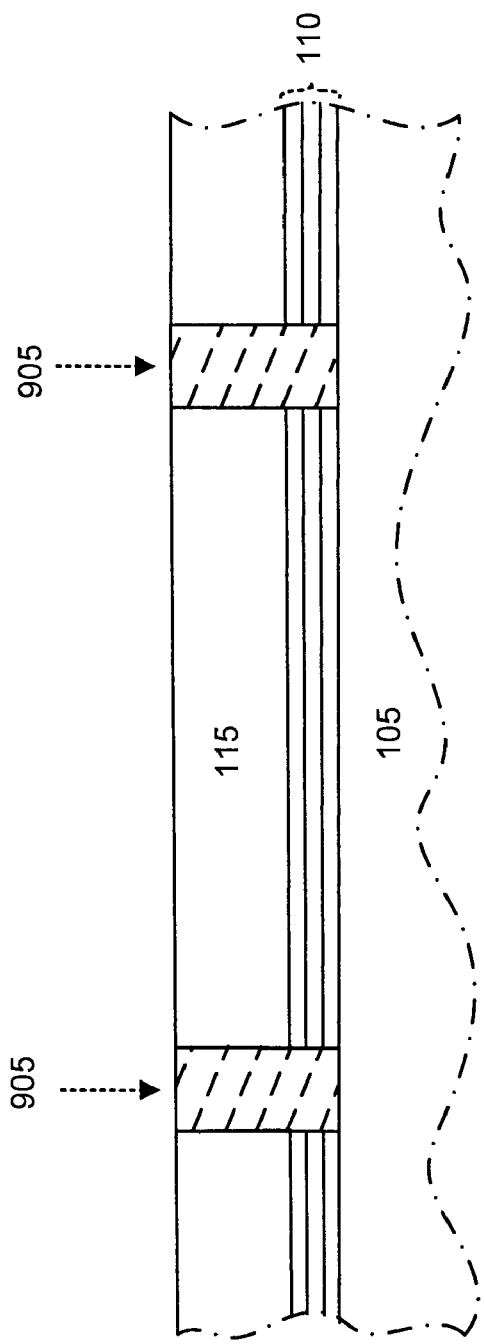
Figure 10:
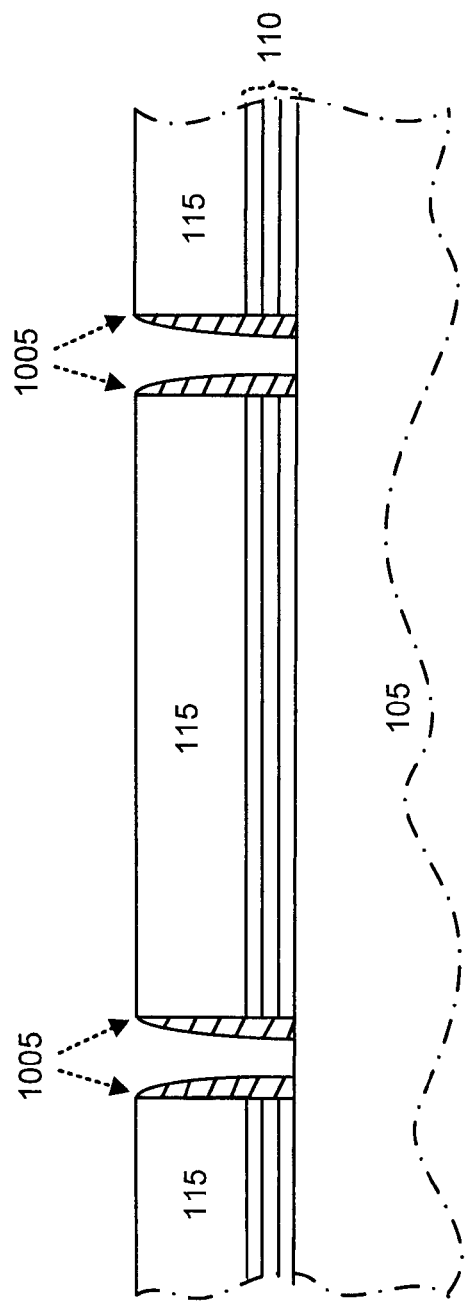
FIG. 10 illustrates the removal of oxide from the structure of FIG. 9 to form trenches and formation of spacers in the formed trenches.

Layer 705 and layers 130, 125 and 120 may be polished back to a residual portion of BARC layer 120, which acts as a polish stop layer, as shown in FIG. 8. An existing chemical mechanical polishing (CMP) technique may be used to polish back layers 705, 130, 125 and 120. As further shown in FIG. 9, the residual portion of BARC layer 120 may then be removed using existing chemical stripping techniques. Removal of the residual portion of BARC layer 120 leaves a portion 905 of layer 705 within each trench 605. The portion 905 of layer 705 may then be etched using existing etching processes to produce spacers 1005 on sidewalls of each trench 605, as illustrated in FIG. 10.

Figure 11:
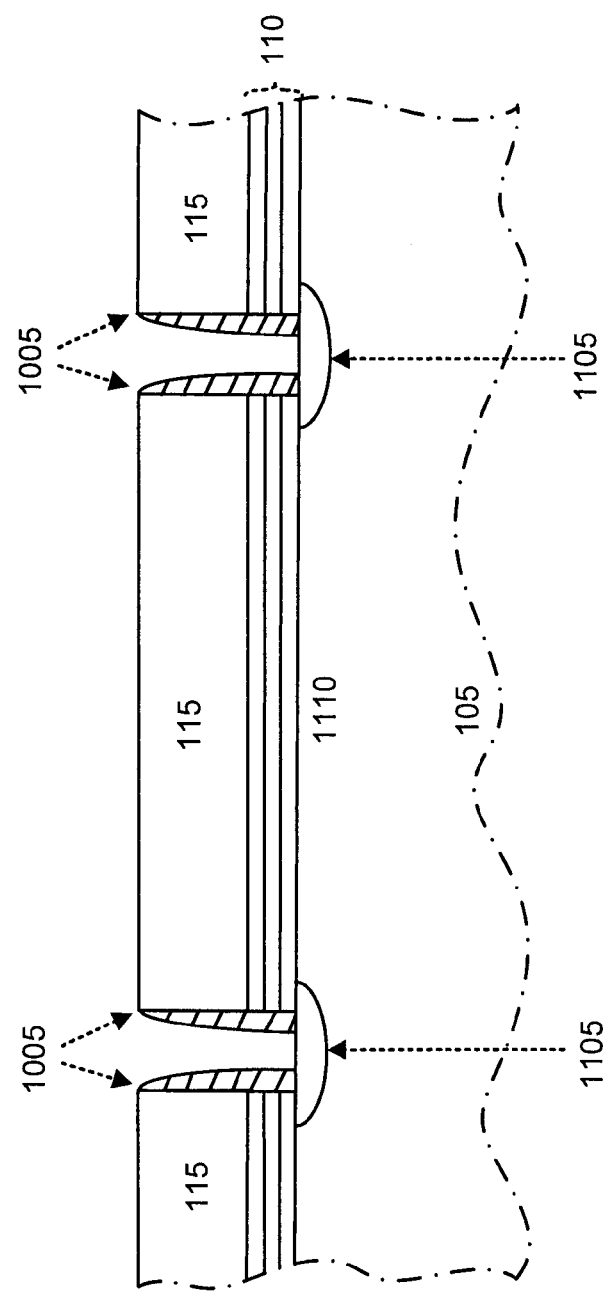
FIG. 11 illustrates the formation of source/drain regions in the structure of FIG. 10 consistent with an aspect of the invention.

Source/drain regions 1105 may then be formed in substrate 105, as shown in FIG. 11, by implanting impurities in each trench 605 between spacers 1005. Source/drain regions 1105 may be doped with n-type or p-type impurities based on particular end device requirements. The particular implantation dosages and energy used to implant the impurities is not described herein in order not to unduly obscure the thrust of the invention. One of ordinary skill in the art, however, would be able to optimize the formation of source/drain regions 1105 based on the particular end device requirements. Formation of source/drain regions 1105 creates a channel region 1110 in substrate 105 between the source/drain regions 1105.

Figure 12:
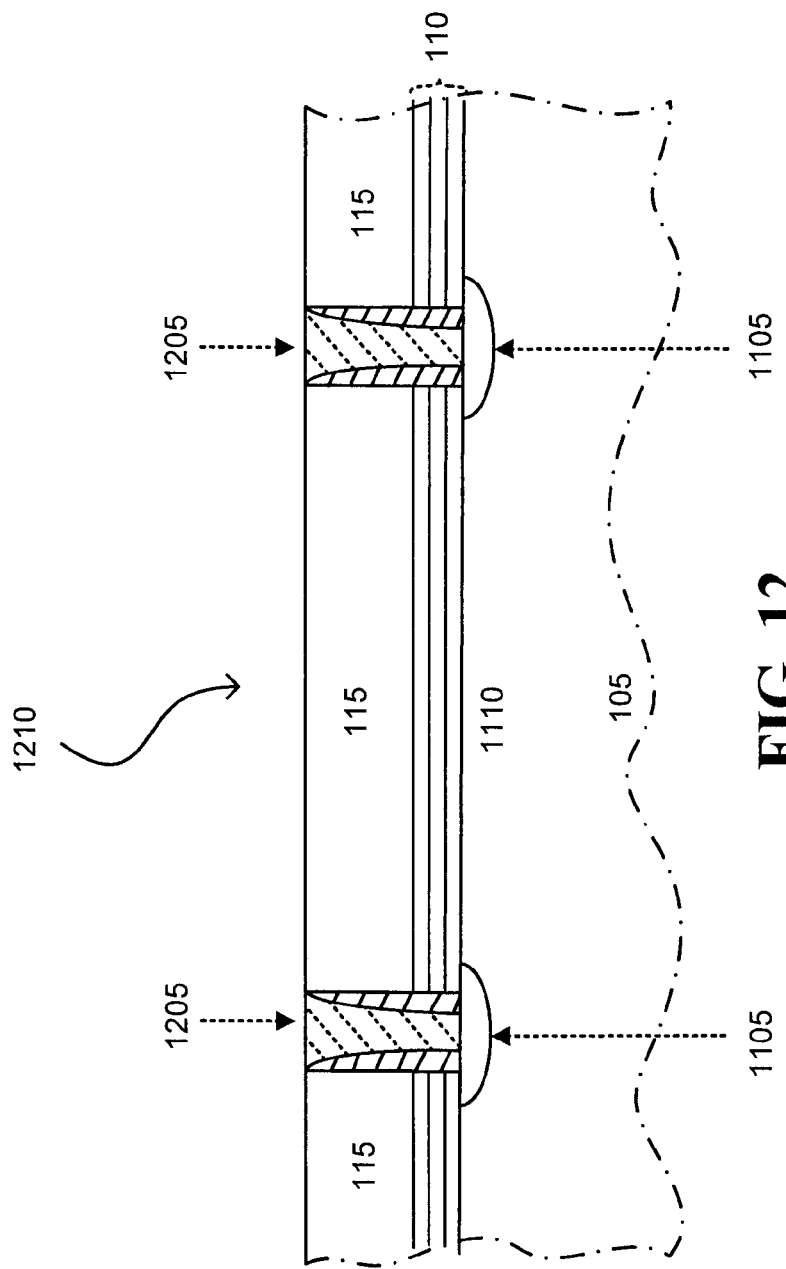
FIG. 12 illustrates the formation of bitlines in the trenches of FIG. 11 consistent with an aspect of the invention.

Conductive bitlines 1205 may then be formed in each trench 605, as shown in FIG. 12. Bitlines 1205 may be formed in each trench 605 using, for example, existing deposition techniques. Bitlines 1205 may include a conductive material, such as, for example, polysilicon, metals, or suicides. After formation of a bitline 1205 in each trench 605, the conductive material of the bitlines 1205 may be polished back co-planar with layer 115.

As shown in FIG. 12, formation of source/drain regions 1105 produces a memory cell 1210 that includes an ONO stack 110 and a layer 115 that serves as the memory cell gate electrode. In an exemplary implementation, during operation of memory cell 1210, voltages may be applied to gate electrode 115, and bit-lines 1205 on either side of gate electrode 115. The applied voltages may cause electrical charge from bit-lines 1205 on either side of cell 1210 to propagate across channel region 1110 and to tunnel from the channel region 1110 through the bottom oxide layer of ONO stack 110 for retention in the charge storage layer of ONO stack 110. The layered ONO stack 110 that includes the bottom oxide layer, charge storage layer, and top oxide layer permits channel erase in memory cell 1210, where charge in gate electrode 115 may be discharged via channel region 1110.

In an exemplary implementation consistent with the invention, memory cell 1210, as illustrated in FIG. 12, may be configured to store charge representing two bits of data. That is, the charge storage layer of ONO stack 110 may be programmed to store charges representing two separate bits of data by localizing the first and second charges to the respective left and right sides of the charge storage layer. For example, charge representing each of the two bits of each memory cell 1210 may be programmed independently by, for example, channel hot electron injection, to store charge representing a bit on each respective side of the charge storage layer. In this manner, the charges in the charge storage layer become effectively trapped on each respective side of the charge storage layer. During erasing, the charges stored in the charge storage layer may tunnel through the bottom oxide layer of ONO stack 110 into the source region and drain region 1105, respectively. In this manner, the density of an array of multiple memory cells 1210 may be increased as compared to conventional memory devices that store charge representing only one bit of data per cell. In alternative implementations, each memory cell 1210 may be configured to store charge representing one bit of data per memory cell 1210.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A method, comprising:
    forming a first layer directly on a layer of material, the first layer being formed to a thickness ranging from about 50 Å to about 250 Å, where the first layer comprises a layer of silicon oxynitride (SiON);
    forming a second layer directly on the first layer, the second layer being formed to thickness ranging from about 200 Å to about 600 Å, where the second layer comprises a layer of silicon nitride ($Si_3N_4$) and has an extinction coefficient ranging from about 0.9 to about 1.3;
    forming a third layer directly on the second layer, the third layer being formed to a thickness ranging from about 200 Å to about 400 Å, where the third layer comprises $Si_3N_4$ and has an extinction coefficient ranging from about 0.2 to about 0.5; and
    etching a pattern in the layer of material using the first layer, the second layer, and the third layer as a mask.

2. The method of claim 1, further comprising:
    forming a layer of photo-resist over the third layer; and
    forming the pattern in the layer of photo-resist using photolithography.

3. The method of claim 1, further comprising:
    forming at least one spacer adjacent side surfaces of the first layer, the second layer, and the third layer.

4. The method of claim 1, further comprising:
    etching the first layer, the second layer, and the third layer to form a trench; and
    forming a conductive bitline in the trench.

5. A method of forming a trench in a material, the method comprising:
    forming a layer of silicon oxynitride (SiON) directly on the material, the layer of SiON being formed to a thickness ranging from about 50 Å to about 250 Å;
    forming a first anti-reflective layer directly on the layer of SiON, the first anti-reflective layer having a first extinction coefficient ranging from about 1.0 to about 1.3 and comprising silicon nitride ($Si_3N_4$), the first anti-reflective layer being formed to a thickness ranging from about 200 Å to about 600 Å;
    forming a second anti-reflective layer directly on the first anti-reflective layer, the second anti-reflective layer having a second extinction coefficient ranging from about 0.2 to about 0.5 and comprising $Si_3N_4$, the second anti-reflective layer being formed to a thickness ranging from about 200 Å to about 400 Å;
    forming a first trench through the first anti-reflective layer, the second anti-reflective layer, and the layer of SiON;
    forming a second trench in the material through the first trench; and
    removing the first anti-reflective layer, the second anti-reflective layer, and the layer of SiON.

6. The method of claim 5, where forming the first trench comprises:
    forming a layer of photo-resist over the second anti-reflective layer;
    forming, using photolithography, a pattern in the photo-resist that corresponds to a shape of the first trench; and
    etching the first anti-reflective layer, the second anti-reflective layer and the layer of SiON to create the first trench.

7. The method of claim 5, further comprising:
    filling the first trench and the second trench with an oxide material.

8. The method of claim 7, further comprising:
    polishing the first anti-reflective layer, the second anti-reflective layer, and a portion of the layer of SiON to leave a residual portion of the layer of SiON.

9. The method of claim 5, forming at least one spacer adjacent side surfaces of the layer of SiON, the first anti-reflective layer, and the second anti-reflective layer.

10. The method of claim 5, further comprising:
    forming a conductive bitline in the second trench.

* * * * *